(12) United States Patent  
Abbott

(10) Patent No.: US 9,059,185 B2  
(45) Date of Patent: Jun. 16, 2015

(54) COPPER LEADFRAME FINISH FOR COPPER WIRE BONDING

(71) Applicant: Texas Instruments Incorporated, Dallas, TX (US)

(72) Inventor: Donald C. Abbott, Norton, MA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 64 days.

(21) Appl. No.: 13/939,328

(22) Filed: Jul. 11, 2013

(65) Prior Publication Data

US 2015/0014829 A1    Jan. 15, 2015

(51) Int. Cl.
*H01L 21/82* (2006.01)
*H01L 21/56* (2006.01)

(52) U.S. Cl.
CPC ...................................... *H01L 21/56* (2013.01)

(58) Field of Classification Search
None
See application file for complete search history.

(56) References Cited

U.S. PATENT DOCUMENTS

| 2003/0011048 A1* | 1/2003 | Abbott et al. ................. 257/666 |
| 2003/0146497 A1* | 8/2003 | Abbott et al. ................. 257/666 |
| 2009/0014848 A1* | 1/2009 | Ong Wai Lian et al. ....... 257/666 |

* cited by examiner

*Primary Examiner* — Charles Garber
*Assistant Examiner* — Brigitte Paterson
(74) *Attorney, Agent, or Firm* — Steven A. Shaw; Frank D. Cimino

(57) ABSTRACT

A semiconductor device (100) includes a leadframe having a chip pad (110) and a lead (111) with a first end (112) proximate to the pad and a second end (113) remote from the pad, the leadframe having a base metal (120) including copper and a stack of a plated first layer (121) of nickel in contact with the base metal and a plated second layer (122) of a noble metal in contact with the nickel layer, the second lead end free of the noble metal. Further included is a copper wire (104) having a ball bond (104*a*) on a semiconductor chip (101) attached to the chip pad, and a stitch bond (104*b*) on the proximate lead end, the stitch bond penetrating the second layer; furthermore a packaging compound (130) encapsulating the chip, the wire, and the first end of the lead, the compound leaving the second end of the lead un-encapsulated; and the unencapsulated second lead end covered with a plated third layer (123) of solder.

7 Claims, 1 Drawing Sheet

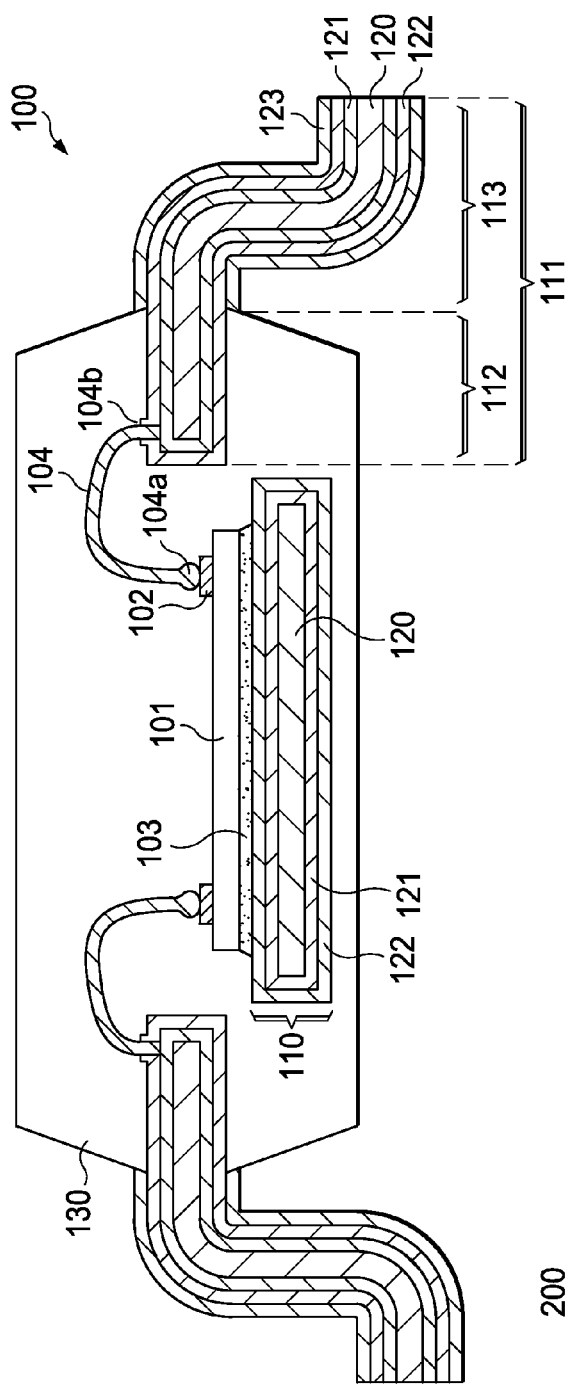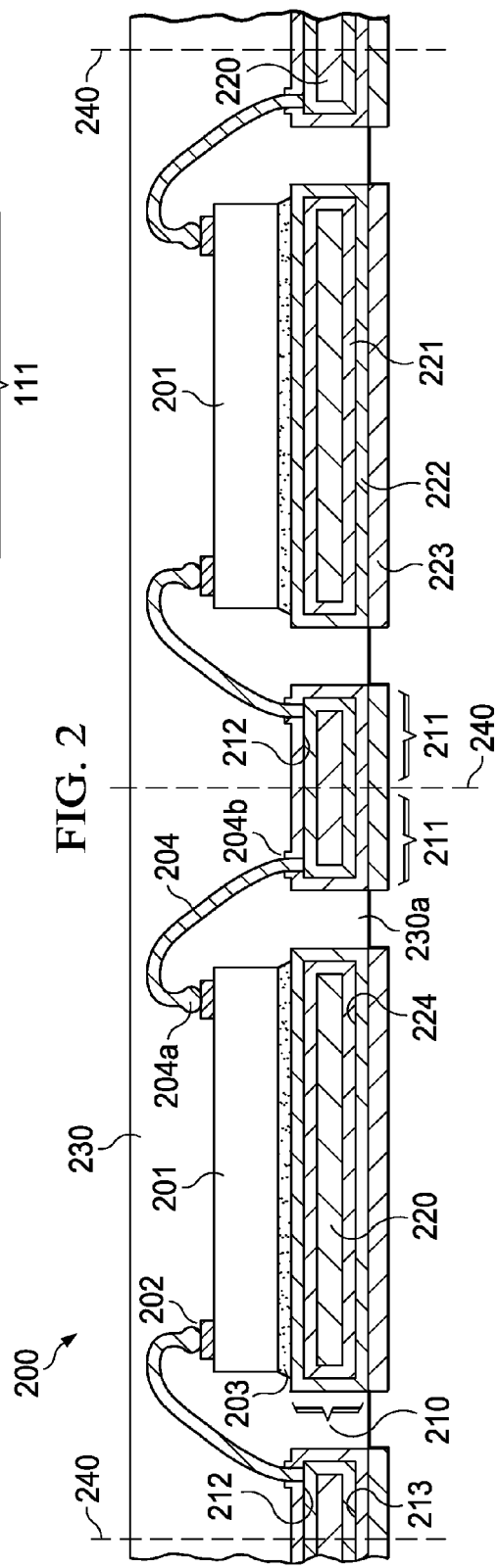

COPPER LEADFRAME FINISH FOR COPPER WIRE BONDING

FIELD OF THE INVENTION

The present invention is related in general to the field of semiconductor devices and processes, and more specifically to the materials, surface finish, and fabrication method of copper leadframes suitable for copper wire bonding of integrated circuit chips to copper leadframes.

DESCRIPTION OF RELATED ART

Leadframes for semiconductor devices provide a stable support pad for firmly positioning the semiconductor chip, usually an integrated circuit (IC) chip, within a package. In addition, leadframes offer a plurality of leads as terminals of the packaged device. It has been common practice to manufacture single piece leadframes from thin (about 120 to 250 μm) sheets of metal. For reasons of easy manufacturing, the commonly selected starting metals are copper alloys, iron-nickel alloys (for instance the so-called "Alloy 42"), and aluminum. The desired shape of the leadframe is stamped or etched from the original sheet. An individual lead of the leadframe typically takes the form of a thin metallic strip with the particular geometric shape determined by the design. For most purposes, the length of a typical lead is considerably longer than its width.

In a typical leadframe, the leads are brought into close proximity of the chip so that the remaining gaps between the proximate ends of the leads (so-called inner lead ends) and the contact pads on the IC surface can be bridged by connectors, for which conventionally thin metal wires such as gold are selected with a diameter range from about 20 to 30 μm. Recently, for cost reduction purposes and improved electrical performance, copper wire has replaced gold wire in some applications. Consequently, the surface of the inner lead ends has to be metallurgically suitable for stitch-attaching the connectors, while ball-attaching of the connectors is the preferred method at the chip contacts. In order to facilitate the stitch attachment especially for copper wires, silver is selectively plated directly on the copper-alloy leadframe in the area for stitch bonding (so-called spot-plating). Alternatively, the entire surface of a copper alloy leadframe is flood-plated with a stack of metal layers including nickel (Ni) on the copper, followed by palladium (Pd) and by gold (Au) to ensure stitch bonding with copper wires.

The ends of the leads remote from the IC chip (so-called outer lead ends) need to be electrically and mechanically connected to external circuitry such as printed circuit boards. This attachment is customarily performed by soldering, conventionally with a tin alloy solder at a reflow temperature above 200° C. Consequently, the surface of the outer segment ends needs to have a metallurgical configuration suitable for reflow attachment to external parts. Copper leadframes spot-plated with silver require post-mold plating of matte tin of the leads outside the plastic to guarantee solderability of the leads by the end user. Leadframes flood-plated with NiPdAu are solderable without the need for post-mold plating.

Finally, the leadframe provides the framework for encapsulating the sensitive chip and fragile connecting wires. Encapsulation using plastic materials, rather than metal cans or ceramic, has been the preferred method due to low cost. The transfer molding process for epoxy-based thermoset compounds at 175° C. has been practiced for many years. The temperature of 175° C. for molding and mold curing (polymerization) is compatible with the temperature of >200° C. for eutectic solder reflow, or for reflow at temperatures >250° C. for Pb-free solder alloys.

Reliability tests such as temperature cycling in moist environments require that the molding compounds have good adhesion to the leadframe and to the encapsulated device parts. Two major contributors to good adhesion are the chemical affinity between the molding compound and the metal finish of the leadframe, and the surface roughness of the leadframe.

In recent years, a number of technical trends have made it challenging to find a satisfactory solution for the diverse requirements. As examples, the package dimensions are shrinking, offering less surface for adhesion. Then, the desire to use Pb-free solders pushes the reflow temperature range into the neighborhood of about 260° C., making it more difficult to maintain mold compound adhesion to the leadframes. This is especially true for the very small leadframe surface available in QFN (Quad Flat No-lead) and SON (Small Outline No-lead) devices.

Since the price of noble metals has increased dramatically in the last few years, it would be desirable to eliminate or drastically reduce all precious metals from the leadframe and to provide a surface readily wire bondable with copper wires, and reliably solderable with tin-based solders. Investigations have been conducted to bond copper wires to copper alloy based leadframes plated with pure copper. It turned out that extraordinary and costly measures must be taken during or prior to wire bonding to reduce any copper oxide (i.e. chemical reduction, redox reaction) that naturally forms on the copper leadframe surface in order to enable copper to copper wire bonding. Such measures as forming gas in specially designed chambers in the wire bonder may offset the precious metal savings and require expensive and specialized wire bonders.

SUMMARY OF THE INVENTION

Recognizing the high cost and reliability issues associated with selective plating silver spots coupled with post-mold tin plating, and of pre-plating whole leadframes with stacked Ni—Pd—Au finishes, applicant discovered the technical and cost advantage of flood plating copper alloy leadframes with thin Ni—Au or Ni—Pd layers, followed by post-mold recovery of the noble metals outside the plastic package during the lead plating process with matte tin. The nickel layer is a reliable tin whisker mitigation technique for matte tin finished leads; and of course the absence of silver implies zero risk of silver dendrites. The preferred thickness range of the nickel layer on the copper alloy is between about 0.5 and 2.0 μm, the gold layer between about 0.003 and 0.009 μm, and the palladium layer between about 0.02 and 0.06 μm. The gold or palladium protects the nickel from oxidation, while the copper wire bond is performed to the nickel surface, punching through the thin layer of gold or palladium.

It is a technical advantage that leadframes with a surface of nickel+gold or nickel+palladium offer good adhesion to molding compounds.

There are technical advantages, when the leadframe and its method of fabrication are flexible enough to be applied for different semiconductor product families and a wide spectrum of design and assembly variations, and achieve improvements toward the goals of improved process yields and device reliability. There are further technical advantages, when these innovations are accomplished using the installed equipment base (for instance bonders) so that no investment in new manufacturing machines such as a leadframe pretreatment station prior to wire bonding is needed. It is a special advantage that there is no need for forming gas to reduce the oxidized copper leadframe surface and protect it from oxidation.

BRIEF DESCRIPTION OF THE DRAWINGS

FIG. 1 illustrates a cross section of an embodiment of the invention showing an encapsulated semiconductor device with a preplated leadframe, connecting wires with stitch bonds to pre-plated leads, and un-encapsulated cantilever leads with a post-mold plated additional layer.

FIG. 2 depicts a cross section of another embodiment of the invention showing an encapsulated semiconductor device with a preplated leadframe, connecting wires with stitch bonds to pre-plated leads, and un-encapsulated flat leads with a post-mold plated additional layer.

DETAILED DESCRIPTION OF THE PREFERRED EMBODIMENTS

FIGS. 1 and 2 illustrate examples of leadframe-based semiconductor devices incorporating an embodiment of the invention. Both examples are devices with a plastic, preferably molded, encapsulation and leads, which are assembled using surface mount technology. The exemplary device of FIG. 1, generally designated 100, has a wire bonded chip in a small-outline package with cantilevered gull-wing shaped outer leads. The exemplary device of FIG. 2, generally designated 200, has a wire-bonded chip in a small-outline no-lead (SON) or quad-flat no-lead (QFN) package with flat outer leads.

In the schematic cross section of FIG. 1, device 100 has a semiconductor chip 101 with a plurality of bond pads 102 suitable for wire bonding, especially ball bonding. Chip 101 is attached by adhesive layer 103 to the chip assembly pad 110 of a leadframe. As FIG. 1 shows, pad 110 as well as the leads 111 of the leadframe consist of a base metal 120 and a plurality of surface layers 121, 122, and 123.

As defined herein, the starting material of the leadframe is called the "base metal", indicating the type of metal. Consequently, the term "base metal" is not to be construed in an electrochemical sense (as in opposition to "noble metal") or in a structural sense.

The preferred base metal for the leadframes in FIG. 1 is copper or a copper alloy. Base metal alternatives include brass, aluminum, iron-nickel alloys (for instance the so-called Alloy 42), and Kovar™. Typically, the leadframe originates with a metal sheet with a preferred thickness in the range from about 100 to 300 μm; thinner sheets are possible. The ductility in this thickness range provides the 5 to 15% elongation that facilitates an intended bending and forming operation. The configuration or structure of the leadframe is stamped or etched from the starting metal sheet.

The structural elements of the leadframe in the exemplary embodiment of FIG. 1 include the chip mount pad 110 and a plurality of leads 111. Each lead 111 has a first end 112 proximate to pad 110 and a second end 113 remote from pad 110; first lead end 112 is inside the package of device 100 and second lead end 113 is outside the package.

As FIG. 1 shows, all structural elements of the leadframe have on their surfaces a stack of two metal layers 122 and 123. First layer 122 is preferably made of nickel and is in contact with and covers all base metal surfaces of the leadframe. The preferred thickness range of first layer 121 is between about 0.5 and 2.0 μm. Alternatively, a layer of a metal such as cobalt, or a metal alloy suitable for stitch bonds with copper is acceptable.

In contact with first layer 121 is second layer 122, which is made of a noble metal. The preferred choices of noble metal are palladium and gold. When second layer 122 is made of palladium, layer 122 is preferably in the thickness range from about 0.02 to 0.06 μm. When second layer 122 is made of gold, layer 122 is preferably in the thickness range from about 0.003 to 0.009 μm.

In FIG. 1, the semiconductor chip 101 may be made of silicon, silicon germanium, gallium nitride, gallium arsenide, or any III-V or II-IV compound used for semiconductor devices. Chip 101 has bond pads 102 with metallization suitable for copper ball bonding; the surface of pads 102 is preferably aluminum, gold, palladium, or pure copper. Chip 101 is attached to chip pad 110 using adhesive material 103 (typically an epoxy or polyimide which has to undergo polymerization).

The electrical interconnections 104 shown in FIG. 1 are preferably copper wires spanning the gap between chip bond pads 102 and first lead ends 112. The preferred bonding technique is ball bonding with the ball 104a attached to pad 102; alternatives include ribbon bonding and wedge bonding. Due to its high electrical conductivity, copper wires 104 are preferably in the diameter range from about 10 to 25 μm; thicker and thinner wire diameters have been used. When alternatively wire 104 is made of gold or aluminum, wire diameters are preferably between about 15 and 30 μm. The contact of wire 104 to first lead end 112 is provided by stitch bonds 104b.

As FIG. 1 indicates, stitch bond 104b is welded to the outermost layer 122, which is a noble metal (palladium or gold), where it typically breaks through the very thin layer and is actually attached to layer 121 made of nickel. Since this nickel was plated and then always protected by the plated layer 122 of noble metal (see method below), it is free of oxidized surface films. Consequently, stitch bond 104b can be stitch-attached with some pressure to result in a reliable bond.

In FIG. 1, packaging material 130 encapsulates the chip 101, the interconnections 104, and the first lead ends 112, but leaves the second lead ends 113 un-encapsulated. Preferably, the packaging material 130 is an epoxy-based molding compound, filled with inorganic fillers such as alumina and silicon dioxide; the molding compound is suitable for adhesion to silicon and the leadframe surfaces. The molding compound requires an extended polymerization period ("curing"; commonly at 175° C. for 5 to 6 hr).

As FIG. 1 schematically illustrates, the second lead ends 113 outside the package of material 130 have the base metal 120 (preferably copper) covered by layer 121 (preferably nickel) and layer 122 (noble metal); as mentioned below, in some device fabrication methods, layer 122 has been stripped during the step of depositing layer 123. In addition, second lead ends 113 have a third layer 123 attached, which forms the outermost metal layer of device 100. Third layer 113 consists of a metal or an alloy suitable as solder in a reflow step. Preferably layer 123 is made of matte tin in the thickness range from about 7 to 20 μm; alternatively, layer 113 may be a low-melting solder alloy.

FIG. 2 illustrates exemplary semiconductor devices 200 based on a strip of QFN-type leadframes and on the application of wire bonding between chips and leads. Dashed lines 240 indicate the locations, where a saw will eventually cut the completed leadframe strip into discrete devices. The saw is cutting through encapsulation material 230 as well as through the leadframe leads.

In FIG. 2, semiconductor chips 201 with a plurality of bond pads 202 suitable for wire bonding, especially ball bonding, are attached by adhesive layers 203 to the chip assembly pads 210 of the leadframe strip. As FIG. 2 shows, pads 210 as well as leads 211 of the leadframe strip consist of a base metal 220 and a plurality of surface layers 221, 222, and 223.

The preferred base metal for the leadframe strip in FIG. 2 is copper or a copper alloy. Base metal alternatives include brass, aluminum, iron-nickel alloys (for instance the so-called Alloy 42), and Kovar™. Typically, the leadframe strip originates with a metal sheet with a preferred thickness in the range from about 100 to 300 µm; thinner sheets are possible. The ductility in this thickness range provides the 5 to 15% elongation that facilitates an intended bending and forming operation. The configurations or structures of the individual leadframes are stamped or etched from the starting metal sheet.

The structural elements of the leadframe in the exemplary embodiment of FIG. 2 include the chip mount pad 210 and a plurality of leads 211. Each lead 211 has a first surface 212 proximate to the assembled chip 201 and a second surface 113 remote from assembled chip 201; first lead surface 212 is inside the package 230 and second lead surface 213 is outside the package.

As FIG. 2 shows, all structural elements of the leadframe have on their surfaces a stack of two metal layers 221 and 222. First layer 221 is preferably made of nickel and is in contact with and covers all base metal surfaces of the leadframe. The preferred thickness range of first layer 221 is between about 0.5 and 2.0 µm. Alternatively, a layer of a metal such as cobalt, or metal alloy suitable for stitch bonds with copper is acceptable.

In contact with first layer 221 is second layer 222, which is made of a noble metal. The preferred choices of noble metal are palladium and gold. When second layer 222 is made of palladium, layer 222 is preferably in the thickness range from about 0.02 to 0.06 µm. When second layer 222 is made of gold, layer 222 is preferably in the thickness range about 0.003 to 0.009 µm.

The electrical interconnections 204 between chip contact pads 202 and first lead ends 212 are preferably copper wires spanning the gap between bond pads and first lead ends with some arc. The preferred bonding technique is ball bonding with the ball 204a attached to pad 202; alternatives include ribbon bonding and wedge bonding. Due to its high electrical conductivity, copper wires 104 are preferably in the diameter range from about 10 to 25 µm; thicker and thinner wire diameters have been used. When alternatively wire 104 is made of gold or aluminum, wire diameters are preferably between about 15 and 30 µm. The contact of wire 204 to first lead surface 212 is provided by stitch bonds 204b.

As FIG. 2 indicates, stitch bond 204b is welded to the outermost layer 222, which is a noble metal (palladium or gold), where it typically breaks through the very thin layer and is actually attached to layer 221 preferably made of nickel. Since this nickel was plated and then always protected by the plated layer 222 of noble metal (see method below), it is free of oxidized surface films. Consequently, stitch bond 204b can be stitch-attached with some pressure to result in a reliable bond.

In FIG. 2, packaging material 230 encapsulates the chips 201, the interconnections 204, and the first lead ends 212, but leaves the second lead ends 213 un-encapsulated. In addition, the goal of improved spreading and dissipation of thermal energy suggests to also leave the chip pad surface 224 opposite the attached chip un-encapsulated. Preferably, the packaging material 230 is an epoxy-based molding compound, filled with inorganic fillers such as alumina and silicon dioxide; the molding compound is suitable for adhesion to silicon and the leadframe surfaces. The molding compound requires an extended polymerization period.

As FIG. 2 schematically illustrates, the second lead ends 213 and the exposed surface 224 of pads 210 have an attached third, outermost layer 223, which protrudes beyond the surface 230a of packaging compound 230. Layer 223 consists of a metal or a metal alloy suitable for the reflow step for attaching the finished devices to outside parts. Preferably, layer 223 is matte tin in the thickness range from about 7 to 20 µm; alternatively layer 223 may be a low-melting solder alloy.

Another embodiment of the invention is a method for fabricating a semiconductor device using a leadframe, which has been preplated with a stack of a bondable nickel and a thin noble metal layer, and which further needs post-mold plating of un-encapsulated leads with a solder layer such as matte tin. It is preferred to apply the method for devices with copper-based leadframes and copper wire bonding. The method allows recovery of the noble metal from the un-encapsulated leads during in the solder plating step.

The method starts with providing a leadframe etched or stamped from a sheet of a base metal. For economic reasons, leadframes are frequently provided in strip form with a plurality of individual leadframes connected by rails. Each leadframe includes a pad for attaching a semiconductor chip, and a plurality of leads, either cantilever-type leads or flat QFN-type leads; each lead has a first end near the chip and a second end remote from the chip. Preferred base metal is copper or a copper alloy; alternative base metals include copper alloy, iron-nickel alloy, and aluminum. After etching or stamping, the whole leadframe strip is plated with a stack of layers. The preferred plating technique is electrolytic plating (flood plating): A plurality of leadframe strips are hung on a line to be exposed to the plating solutions in the plating baths, with electrical bias applied. All of the exposed metal on the leadframe strip is electrically connected and thus allows electrolytic plating. The plated first layer is nickel in contact with the base metal; the plated outermost second layer is a noble metal in contact with the nickel layer; an alternative first layer is made of cobalt. When the noble metal is palladium, the layer thickness is preferably between about 0.02 and 0.06 µm; when the noble metal is gold, the layer thickness is preferably between about 0.003 and 0.009 µm.

In the next process step, semiconductor chips are adhesively attached to the chip pads of the leadframe strip. Then, the chip bond pads are connected with the respective first lead ends by wire bonding. The preferred bonding technique is ball bonding, and the preferred wire material is copper in the wire diameter range from about 10 to 25 µm. The wire stitch bond is attached to the noble metal of the plated second layer, where it typically breaks through the very thin layer and is actually attached to the nickel of the plated first layer.

In the next process step, the chip, the wire bonds, and the first lead ends are encapsulated, for instance in a molding compound by the transfer molding technique. The encapsulation material, however, leaves the second lead ends un-encapsulated. The devices are still in the strip form of the leadframes. Thereafter, the exposed second lead ends are deflashed and cleaned, before the strip proceeds to a plating tank for solder plating.

In the solder plating step, a third metal layer is deposited on the lead portion outside the plastic encapsulation. The preferred metal is matte tin in the thickness range from about 7 to 20 µm; alternate choices include other low-melting solder alloys. It is advantageous to recover the noble metal from the exposed portions of the leadframe strip before the solder layer is deposited. The recovery is executed by reverse plating or so-called stripping of the noble metal from the nickel surface.

This process is performed in a separate de-plating or stripping bath. Included in the bath is a provision to recover the precious metal by resin recovery, by evaporative concentration, or, in a secondary step after the leadframe has been removed from the tank, by plating the stripped noble metal.

The final step in the process flow comprises the operations of trimming and forming the second lead ends (of course, all scrap from these operations is saved for precious metal recovery). The trimming step removes the connecting leadframe rails and singulates the devices, and the forming step results, for example, in the gull wing shapes of the leads illustrated in FIG. 1. At the cut of connecting rails are regions of exposed base metal 120 (e.g., copper).

An alternate technique which avoids any exposed base metal is electroless or immersion plating of the solder layer. This technique performs the plating step after the trim/form step, rather than after the encapsulation (molding) step. After encapsulating the assembled devices of a leadframe strip, the electroless technique performs the operations for trimming the connecting leadframe rails, singulating the units, and forming the second lead ends are executed. Then, the plating process is performed in a strip to strip plating line. As a result, the finished devices do not have regions of exposed base metal; there is also no risk of causing microcracks in the plated solderable metal by bending the outer lead ends in the forming process.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the material of the semiconductor chip may comprise silicon, silicon germanium, gallium arsenide, or any other semiconductor or compound material used in integrated circuit manufacturing.

As another example, the second (outer) segment ends may have a form other than gull wings. For instance, they may be shaped as pins, or as pieces of straight metal as required for so-called leadless devices such as the QFN/SON devices.

As another example, the process step of stamping the leadframes from a sheet of base metal may be followed by a process step of selective etching, especially of the exposed base metal surfaces in order to create large-area contoured surfaces for improved adhesion to molding compounds. The sequence of plating layers according to the invention can accommodate any such specially etched leadframe base structures.

It is therefore intended that the appended claims encompass any such modifications or embodiments.

I claim:

1. A method for fabricating a semiconductor device comprising:
    providing a leadframe having a base metal including copper and a stack of a plated first layer of nickel in contact with the base metal, wherein the thickness of the first layer is in the range from about 0.5 to 2.0 μm and a plated outermost second layer of a noble metal in contact with the nickel layer, the leadframe including a chip pad and a lead having a first end proximate to the pad and a second end remote from the pad;
    forming a ball bond of a copper wire on a semiconductor chip attached to the chip pad;
    forming a stitch bond of the copper wire on the first lead end, penetrating the second layer;
    encapsulating chip and wire in a packaging compound, while leaving the second lead end un-encapsulated;
    removing the second layer of a noble metal from the un-encapsulated second lead ends wherein the noble metal is gold with a thickness of the second layer in the range from about 0.003 to 0.009 μm;
    plating a third layer of solder on the un-encapsulated second lead end;
    trimming the second lead end; and
    forming the second lead end.

2. The method of claim 1 wherein the stitch bond is formed on the first layer.

3. The method of claim 1 wherein the solder is matte tin, the thickness of the third layer is between about 7 and 20 μm, and the technique of forming is plating.

4. A method for fabricating a semiconductor device comprising:
    providing a leadframe having a base metal including copper and a stack of a plated first layer of nickel in contact with the base metal and a plated outermost second layer of a noble metal in contact with the nickel layer, the leadframe including a chip pad and a lead having a first end proximate to the pad and a second end remote from the pad;
    forming a ball bond of a copper wire on a semiconductor chip attached to the chip pad;
    forming a stitch bond of the copper wire on the first lead end, penetrating the second layer;
    encapsulating chip and wire in a packaging compound, while leaving the second lead end un-encapsulated;
    removing the second layer of a noble metal from the un-encapsulated leadframe portions, wherein the noble metal is gold with a thickness of the second layer in the range from about 0.003 to 0.009 μm;
    trimming and forming the un-encapsulated second lead end; and
    then plating a third layer of solder on the formed second lead ends.

5. A semiconductor device comprising:
    a leadframe having a chip pad and a lead with a first end proximate to the pad and a second end remote from the pad, the leadframe having a base metal including copper and a stack of a plated first layer of nickel in contact with the base metal and a plated second layer of a noble metal in contact with the nickel layer, the second lead end free of the noble metal, wherein the noble metal is gold and the thickness of the second layer between about 0.003 and 0.009 μm;
    a copper wire having a ball bond on a semiconductor chip attached to the chip pad, and a stitch bond on the proximate lead end, the stitch bond formed on the first layer and penetrating the second layer;
    a packaging compound encapsulating the chip, the wire, and the first end of the lead, the compound leaving the second end of the lead un-encapsulated; and
    the unencapsulated second lead end covered with a plated third layer of solder.

6. The device of claim 5 wherein the thickness of the first layer is in the range from about 0.5 to 2.0 μm.

7. The device of claim 5 wherein the solder is matte tin and the thickness of the third layer is between about 7 and 20 μm.

* * * * *